US007465939B2

(12) United States Patent
Frosien

(10) Patent No.: US 7,465,939 B2
(45) Date of Patent: Dec. 16, 2008

(54) ABERRATION CORRECTION DEVICE AND METHOD FOR OPERATING SAME

(75) Inventor: Juergen Frosien, Riemerling (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 239 days.

(21) Appl. No.: 11/568,175

(22) PCT Filed: Jun. 20, 2005

(86) PCT No.: PCT/EP2005/006647

§ 371 (c)(1),
(2), (4) Date: Nov. 20, 2006

(87) PCT Pub. No.: WO2005/124816

PCT Pub. Date: Dec. 29, 2005

(65) Prior Publication Data
US 2007/0164228 A1    Jul. 19, 2007

(30) Foreign Application Priority Data
Jun. 21, 2004 (EP) .................... 04014507

(51) Int. Cl.
H01J 37/153 (2006.01)
(52) U.S. Cl. .................... 250/396 R; 250/396 ML; 250/305
(58) Field of Classification Search ............. 250/396 R, 250/396 ML, 305
See application file for complete search history.

(56) References Cited

U.S. PATENT DOCUMENTS 3,979,590 A   9/1976  Andersen 6,410,924 B1   6/2002  Wang
6,580,073 B2*  6/2003  Plies et al. .................... 250/305
6,784,437 B2   8/2004  Rose
6,797,962 B1   9/2004  Rose et al.
6,960,763 B2* 11/2005  Lopez et al. ................ 250/305

FOREIGN PATENT DOCUMENTS

| DE | 4204512 A1  | 8/1993  |
| DE | 19926927 A1 | 12/2000 |
| DE | 10159454 A1 | 6/2003  |
| EP | 1335402 A2  | 8/2003  |
| EP | 1517353 A2  | 3/2005  |
| EP | 1521289 A1  | 4/2005  |

OTHER PUBLICATIONS

International Search Report dated Nov. 9, 2005.
International Preliminary Report on Patentability dated Jan. 11, 2007.

(Continued)

Primary Examiner—Kiet T Nguyen
(74) Attorney, Agent, or Firm—Patterson & Sheridan, LLP

(57) ABSTRACT

The present invention provides an aberration correction device. The aberration correction device comprises a Wien filter element, a quadrupole element for compensating a focusing property of the Wien filter element, and at least one multipole element for spherical aberration correction. The Wien filter element and said quadrupole element are adapted to generate, in combination, an astigmatic image. Furthermore, the at least one multipole element is adapted to act essentially in a plane of sagittal or meridional focus of the astigmatic image. Thereby, chromatic aberration is reduced as well as spherical aberration can be corrected.

32 Claims, 11 Drawing Sheets

OTHER PUBLICATIONS

H. Rose. "Inhomogeneous Wien filter as a corrector compensating for the chromatic and spherical aberration of low-voltage electron microscopes." Optik. 1990 vol. 84(3): pp. 91-107.

H. Rose. "The retarding Wien filter as a high-performance imaging filter." Optik. 1987 vol. 77(1): pp. 26-34.

* cited by examiner

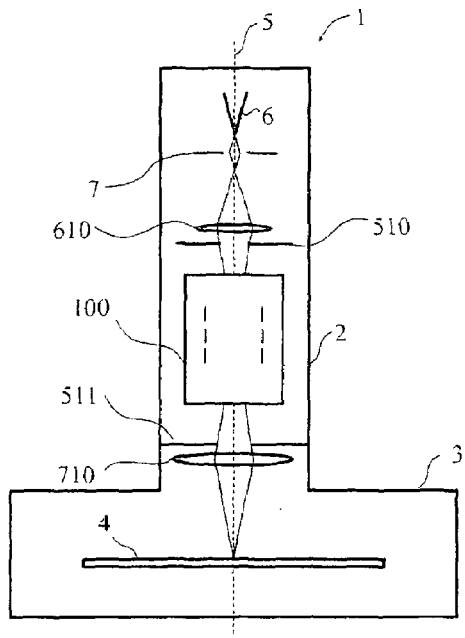
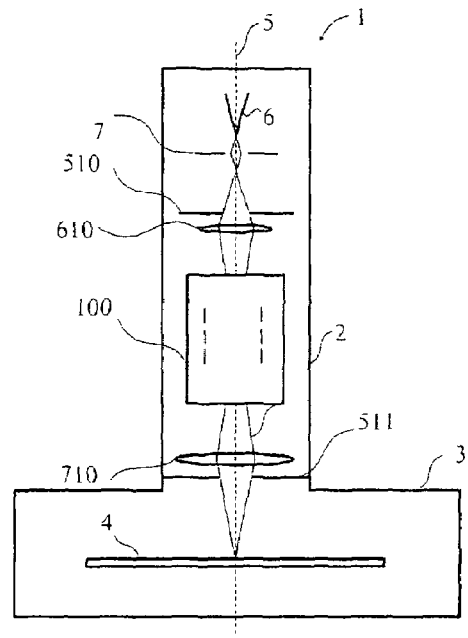
Fig. 6a     Fig. 6b
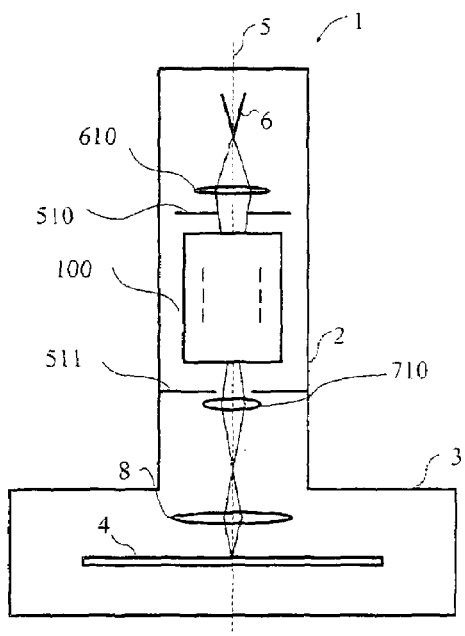
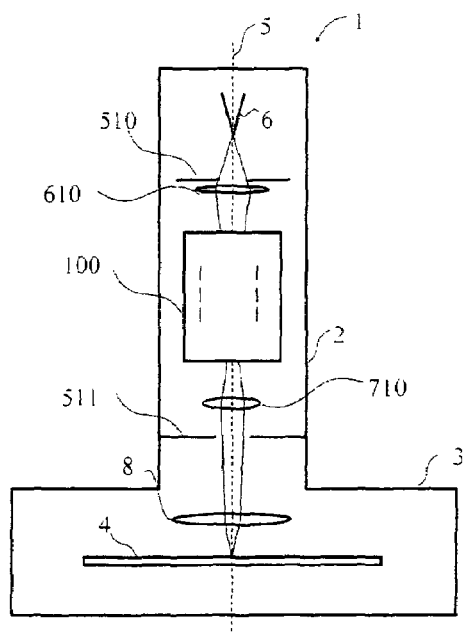
Fig. 7a     Fig. 7b

ABERRATION CORRECTION DEVICE AND METHOD FOR OPERATING SAME

FIELD OF THE INVENTION

The invention relates to charged particle beam devices for inspection system applications, testing system applications, lithography system applications and the like. Particularly, it relates to an aberration correction device for such a charged particle beam device. The invention also relates to a method of operation thereof.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

The charged particle beam devices used in the field of semiconductor comprise lithographic devices, inspection devices as well as CD (critical dimension) measurement and DR (defect review) devices. Typically, low voltage electron microscopy is used for semiconductor inspection and metrology to avoid charging of the semiconductor substrate and damage resulting therefrom.

However, in modern low voltage electron microscopes, aberrations limit the achievable resolution to approximately 3 nm for 1 keV electron energy and considerable effort has been done to optimize the lens aberrations, especially those of the objective lens. Lens optimization has been pushed to the limits in recent years so that aberration correction becomes more and more important.

For low energy applications, chromatic aberration is dominant. The diameter of the aberration disc of the chromatic aberration in the Gaussian image plane of an objective is proportional to the relative energy width $\Delta E/E$ of the charged particle beam. It is already known to utilize monochromators, in order to further increase the resolution. Thereby, the energy width $\Delta E$ of the electron beam, which is processed subsequently by the downstream electron-optical imaging system, can be reduced.

Wien filters are known as monochromators for charged particles wherein an electrostatic dipole field and a magnetic dipole field are superposed perpendicularly to each other. For example, EP 03028694.2 (Frosien et al.) describes a Wien filter monochromator with a superimposed quadrupole field that allows for improved reduction of chromatic aberration.

However, with increasing resolution requirements not only chromatic aberration but also spherical aberration has to be reduced or compensated, i.e. corrected, in order to fulfill increasing resolution requirements. The spherical aberration of the total system is dominated by the impairments of the objective lens. In "Chromatic and Spherical Aberration Correction in the LSI Inspection Scanning Electron Microscope" by K. Honda and S. Takashima, JEOL News, Vol. 38, No. 1, 2003, pages 36 to 40, a multipole corrector capable of combined chromatic and spherical aberration correction is described. The corrector consists of 4 stages of 12-pole-pin multipoles and additional coils for the generation of quadrupole fields. It is explained by the authors themselves that this correction system is so complicated that the SEM image may be completely lost due to small errors.

It is therefore an object of the present invention to overcome at least in part the disadvantages associated with the prior art. Preferably, a charged particle system capable of chromatic and spherical aberration correction should be provided. More preferably, the design of such a system is of relatively low complexity.

SUMMARY OF THE INVENTION

This object is solved by an aberration correction device according to independent claim 1 and a method of operating a charged particle beam device according to independent claim 24.

Further advantages, features, aspects and details of the invention are evident from the dependent claims, the description and the accompanying drawings.

According to one aspect of the present invention, an aberration correction device is provided. The aberration correction device comprises a Wien filter element acting in a focusing and dispersive manner in an x-z-plane, wherein z-direction coincides with the optical axis of the device. The Wien filter element is positioned regarding the z-position so that a crossover of a charged particle beam is located essentially in the center-plane (x-y-plane) of the Wien filter element. Further, the aberration correction device comprises a quadrupole element, which acts in the x-z-plane and a y-z-plane. The quadrupole element is positioned regarding the z-position so that the crossover is located essentially in the center-plane (x-y-plane) of the quadrupole element. The effect of the combined electrostatic and magnetic fields allows for chromatic aberration reduction without substantial limitation of the dispersion. Regarding this combined effect of the Wien filter and the quadrupole element with respect to chromatic aberration reduction, the full disclosure of EP 03028694.2 (Frosien et al.) is hereby incorporated by reference.

Further to this, the combined effect of the Wien filter element and the quadrupole element creates astigmatic crossovers, i.e. the crossover in the center plane (x-y-plane) of the Wien filter element occurs only in, e.g., the x-z-plane whereas the beam has no crossover in the y-z-plane at this point. However, the Wien filter element and the quadrupole element can also be adjusted to generate additional astigmatic crossovers in the y-z-plane. The aberration correction device further comprises a multipole element acting in the plane (x-y-plane) of one of the above-mentioned crossovers. The action of the multipole element has no effect in the plane of the crossover, e.g. the x-z-plane for the crossover at the center of the Wien filter element, since the beam is ideally concentrated to a single point. However, spherical aberration can be corrected in an orthogonal direction because the charged particle beam is of finite width in that direction due to the astigmatic image generated by the Wien filter element and the quadrupole element. Thus, not only chromatic but also spherical aberration of the system can be corrected by a single device which is of compact and simple design. Especially, it is an advantage that the aberration correction device according to the embodiments of the present invention requires only a small number of actively controlled elements so that the control of the device can be kept relatively simple and, thus, the sources of errors can be reduced. Also, the device is less sensitive to particle beam interaction compared to prior art devices because of its short length. Further to this, spherical aberration correction and chromatic aberration correction may still be applied separately or combined according to the requirements of the optical system involved.

According to another aspect of the present invention, the multipole element of the aberration correction device has 4m poles, wherein m is an integer greater than or equal to 2. Accordingly, the multipole element is an octupole (m=2), a 12-pole (m=3), 16-pole (m=4) etc. Thus, the 4-fold symmetry of the quadrupole element can be maintained but high order corrections are introduced. In other words, if the multipole element is required to maintain the basic symmetry of the quadrupole but is also required to allow for field corrections, only 4-fold symmetries of a higher order than 4 are allowed for the multipole. Therefore, a 4m-pole element is proposed by the present invention. In a case where the 4-fold symmetry is not required, also multipole elements of other symmetry can be utilized for spherical aberration correction, e.g. a 10-pole. However, the multipole element should be capable of producing an octupole field since the radial dependency of the octupole field coincides with the radial dependency of the spherical aberration except that they have opposite signs. Due to this property, the octupole field is predestined for spherical aberration correction.

According to still another aspect of the present invention, the Wien filter element and the quadrupole element can be operated in a mode in which not only an astigmatic crossover is created at the center of the Wien filter element but also additional 2n astigmatic crossovers are created. Preferably, the 2n additional crossovers are located symmetrically with respect the center of the Wien filter element. Especially, the crossover at the center of the Wien filter element occurs in a plane (x-z-plane) essentially orthogonal to the plane (y-z-plane) of the 2n additional crossovers. Thus, spherical aberration correction can be accomplished at any of the 2n+1 astigmatic crossovers. Particularly, spherical aberration correction in x-direction can be accomplished at y-z-plane crossovers and spherical aberration correction in y-direction can be accomplished at x-z-plane crossovers. In an especially preferred embodiment of the present invention, multipole elements for spherical aberration correction are located at every astigmatic crossover so that an optimum correction ability of the device is provided.

According to a first embodiment of the present invention, the multipole elements are magnetic multipole elements. However, they may also be formed as electrostatic multipole elements or even a combination thereof. Especially, some of the elements may be magnetic and some may be electrostatic. Furthermore, according to still another embodiment of the present invention, the multipole elements can be integrated into the quadrupole element. In this case, it is preferred that the multipole elements have a 4-fold symmetry.

According to still another aspect of the present invention, a first charged particle selection element is positioned upstream the Wien filter element. According to a further aspect of the present invention, a second charged particle selection element can be positioned downstream said Wien filter element. Therein, "upstream" and "downstream" should be understood in terms of the direction from the charged particle source towards the specimen.

According to another aspect the first charged particle selection element is a charged particle angle dependent selection element and the second charged particle selection element is a charged particle energy dependent selection element. Thus, the first charged particle selection element generates a beam shape. After the shaped beam is deflected corresponding to the charged particle energy, the second charged particle selection element blocks charged particles which do not have the nominal energy or an allowed deviation therefrom.

Regarding the specific properties of the first and second charged particle selection elements, the full disclosure of EP 03028694.2 (Frosien et al.) is hereby incorporated by reference. Especially, the full disclosure of EP 03028694.2 (Frosien et al.) is hereby incorporated by reference with respect to the physical implementation and design of the first and second charged particle selection elements.

According to another aspect, the multipole element, the quadrupole element and the Wien filter element are provided by a single multipole component. Thereby, the number of components that have to be adjusted with respect to each other is decreased.

The invention is also directed to an apparatus for carrying out the disclosed methods, including apparatus parts for performing each of the described method steps. These method steps may be performed by way of hardware components, a computer programmed by appropriate software, by any combination of the two, or in any other manner. Furthermore, the invention is also directed to methods by which the described apparatus operates or is manufactured. It includes method steps for carrying out every function of the apparatus.

BRIEF DESCRIPTION OF THE DRAWINGS

Some of the above indicated and other more detailed aspects of the invention, will be described in the following description and partially illustrated with reference to the figures. Therein:

FIGS. 6a and 6b show schematic side views of exemplary embodiments of charged particle beam columns with charged particle beam energy reduction systems according to the present invention;

FIGS. 7a and 7b show schematic side views of exemplary embodiments of charged particle beam columns with charged particle beam energy reduction systems according to the present invention.

DETAILED DESCRIPTION OF THE DRAWINGS

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image.

Those skilled in the art would also appreciate that all discussions herein related to e.g. an x-z- or any y-z-plane are to be understood that the planes are essentially perpendicular to each other. Even though theoretical discussions in this application refer to coordinates in a mathematical sense, the respective components can practically be positioned with respect to each other so that the x-z- and y-z-plane enclose an angle of about 80° to 100°, preferably 87° to 93°, more preferably of about 89° to 91°.

Further, without limiting the scope of protection of the present application, in the following, the charged particle beams will be referred to as primary charged particle beams. The present invention might still be used for secondary and/or backscattered charged particles. Thereby, for example, the energy distribution of charged particles in an imaging optic can be controlled.

Further, without limiting the scope of protection of the present application, within the present application the beam direction corresponds to the z-axis. Unless otherwise noted, the term "length of a field (region)" or "length of a component" describes the dimension in z-direction.

Further, without limiting the scope of protection of the present application, within the present application the term "essentially" is preferably understood as including a ±5%-tolerance in the z-direction, i.e. along the beam direction.

Within the following description of the drawings the same reference numbers refer to the same components. Generally, only the differences with respect to the individual embodiments are described.

Figure 8A:
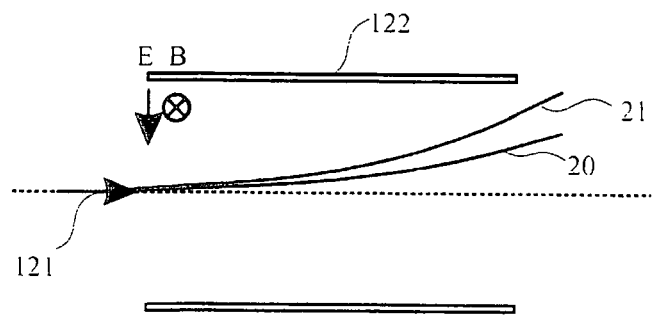
FIGS. 8a to 9b show schematic side views of Wien filters and excitation conditions.

With reference to FIGS. 8 and 9, some principles of the Wien filter will now be described. FIG. 8a shows a Wien filter element 122 and its influence on a charged particle 121. The dipole Wien filter comprises an electrostatic field E and a magnetic field B. The fields are perpendicular with respect to each other. The charged particle, which is indicated by arrow 121, has a non-nominal energy. Only charged particles with the nominal energy would be allowed to pass straight through the Wien filter. Thus, the charged particle 121 is deflected from the optical axis. This results in a charged particle beam 20.

Figure 8B:
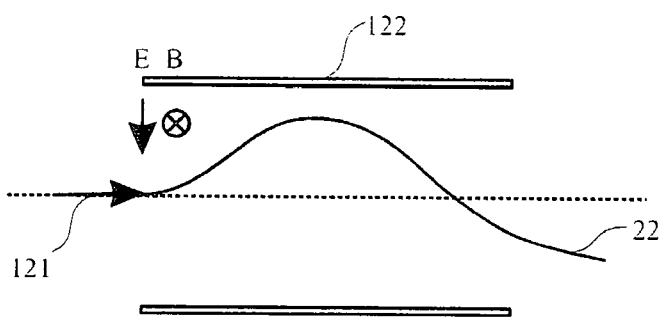

A diagram like the one shown in FIG. 8a can be found in many textbooks. In practice, it is relevant to further increase the excitation of the Wien filter. An example therefore is shown in FIGS. 8a and 8b. Starting to increase the excitation, the excitation leads to an increased deflection angle, as indicated by charged particle beam 21. However, if the excitation of Wien filter 122 is further increased the charged particle beam reaches a limiting deflection angle. A further increase diminishes the deflection angle (see FIG. 8b). The charged particles are deflected towards the optical axis. Thus, even though the excitation is increased, the deflection angle is not increased beyond a certain limit.

Figure 9B:
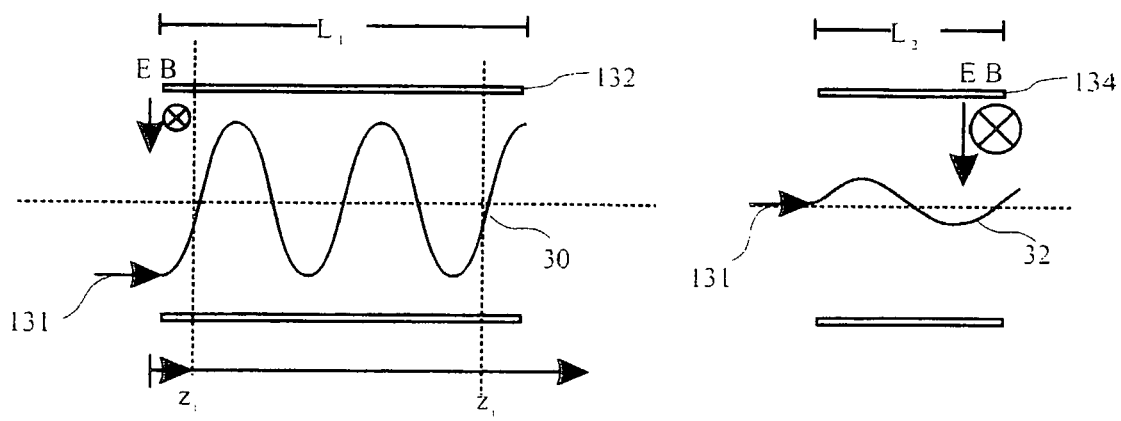
Figure 9A:
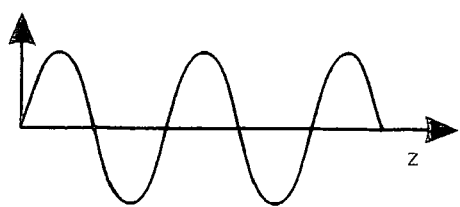

This might be better understood with reference to FIG. 9a. FIG. 9a shows in its upper part a Wien filter 132 having a length $L_1$ along the optical axis (z-axis). An incoming charged particle 131 is imaged due to the electrostatic field and magnetic field. The Wien filter has, additionally to its dispersive properties, imaging properties. The diagram in the lower part of FIG. 9a shows the deflection angle versus the z-position. For position $z_i$ and position $z_{ii}$ the angles are approximately similar. Thus, not the entire excitation could be used to have an increased separation between charged particles of different energy.

The term excitation might be better understood when comparing FIGS. 9a and 9b. The Wien filter of FIG. 9b has a length $L_2$ which is shorter than length $L_1$ of the Wien filter shown in FIG. 9a. However, the beam path 32 is comparable to the beam path 30. This is realized by having higher field strengths of the electrostatic and magnetic fields within Wien filter 134, which is indicated by the larger field symbols. The excitation can be considered to be the product from the length of the Wien filter and the field strengths.

Figure 10A:
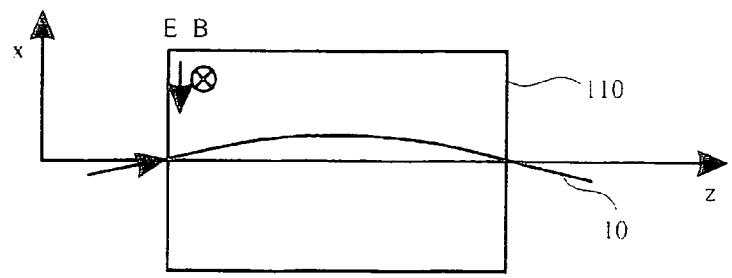
FIG. 10a shows a schematic side view in the x-z-plane of a Wien filter and an exemplary beam path of an electron beam entering the Wien filter.
Figure 10B:
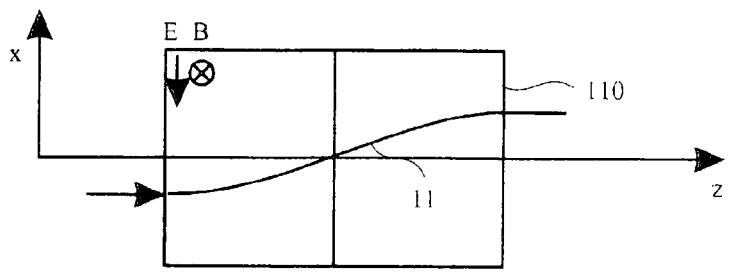
FIG. 10b shows a schematic side view in the x-z-plane of a Wien filter and another exemplary beam path of an electron beam entering the Wien filter.

FIG. 10a shows a view in the x-z-plane of the Wien filter 110. A charged particle, for example an electron, which enters the Wien filter 110 under an angle, follows beam path 10. The same system is shown in FIG. 10b. A different electron entering the Wien filter 110 parallel to the optical axis with an offset thereto, follows e.g. beam path 11. Both of the above described beam paths 10 and 11 are generated due to the focusing action of the Wien filter 110 in the x-z-plane. As described above, this focusing action in the x-z-plane results in an upper limit for the deflection angle in the case of an increasing excitation.

Figure 10C:
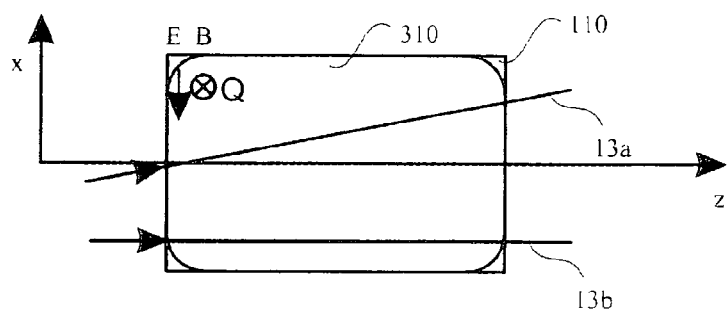
FIG. 10c shows a schematic side view in the x-z-plane of a Wien filter element and a quadrupole element and two exemplary beam paths of electron beams entering the system.

FIG. 10c shows a system, wherein the field of the Wien filter is overlaid with the field of a quadrupole element 310. The quadrupole element is arranged to have a defocusing effect in the x-z-plane. The excitation of the quadrupole element 310 is chosen so that the defocusing effect thereof and the focusing effect of the Wien filter 110 negate each other. Thus, electrons entering the optical system 110/310 do not experience any focusing action in the x-z-plane. As shown in FIG. 10c the particles pass straight through the system as indicated by beam paths 13a and 13b.

Figure 10D:
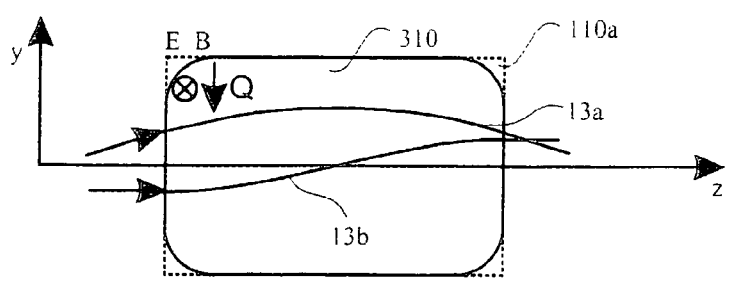
FIG. 10d shows a schematic side view in the y-z-plane of which corresponds to FIG. 10c.

The effect of the combined Wien filter-quadrupole element optical system in the y-z-plane is explained with reference to FIG. 10d. Wien filter 110a is drawn with dotted lines. The dotted lines indicate that the dipole Wien filter does not have any effect on the electrons in the y-z-plane. Consequently, the electrons are only influenced by the quadrupole element in the y-z-plane. The quadrupole element 310, which has a defocusing effect in the x-z-plane, has a focusing effect in the y-z-plane. Exemplary beam paths 13a and 13b can be seen in FIG. 10d.

As described above, the combination of the Wien filter 110 and the quadrupole 310 and can be arranged so that there is no resulting focusing effect in the x-z-plane. Thus, the excitation can be further increased without having an imaging scheme as e.g. shown in FIG. 9a. Nevertheless, the Wien filter element 110 introduces a dispersion for electrons with a non-nominal energy. Thus, the excitation can be increased far beyond the limit that is given by the focusing effect of the Wien filter (see FIGS. 8a to 9b). Consequently, charged particles with a non-nominal energy can be removed from the beam so that the energy width of the charged particle beam is decreased. Thus, chromatic aberration can be considerably reduced.

However, as chromatic aberration is reduced also spherical aberration comes into play and is a limiting factor for resolution. Therefore, a multipole element is provided for correcting the spherical aberration. In the following, a device capable for correcting chromatic aberration as well as spherical aberration is described with reference to FIG. 1.

Figure 1A:
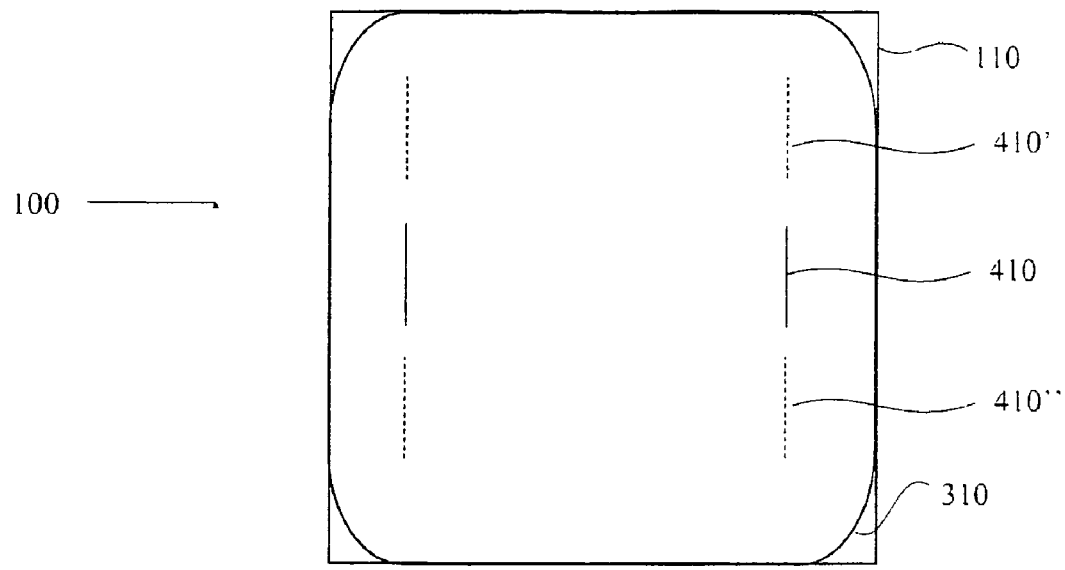
FIGS. 1a to 2b show different embodiments of an aberration correction device according to the present invention.

FIG. 1a is a sectional view of an aberration correction device 100 which comprises a Wien filter element 110, a quadrupole element 310 and a multipole element 410. The Wien filter element 110 and the quadrupole element 310 correspond to the above-described combined Wien filter-quadrupole element.

Multipole element 410 is formed as an axially symmetric octupole in the embodiment shown in FIG. 1a. It is aligned with the optical axis (z-axis) along its axis of symmetry. Multipole element 410 is further aligned with the Wien filter element 110, quadrupole element 310 and the optical axis (z-axis) so that their centers along the optical axis essentially coincide. However, also different positions for the octupole 410 can be chosen along the optical axis as is indicated by reference numerals 410' and 410". As will be described later, the position of the multipole element 410, 410', 410" is selected so that the plane of its action, i.e. the plane where the multipole field is effective, essentially coincides with an astigmatic crossover of a charged particle beam.

Figure 11:
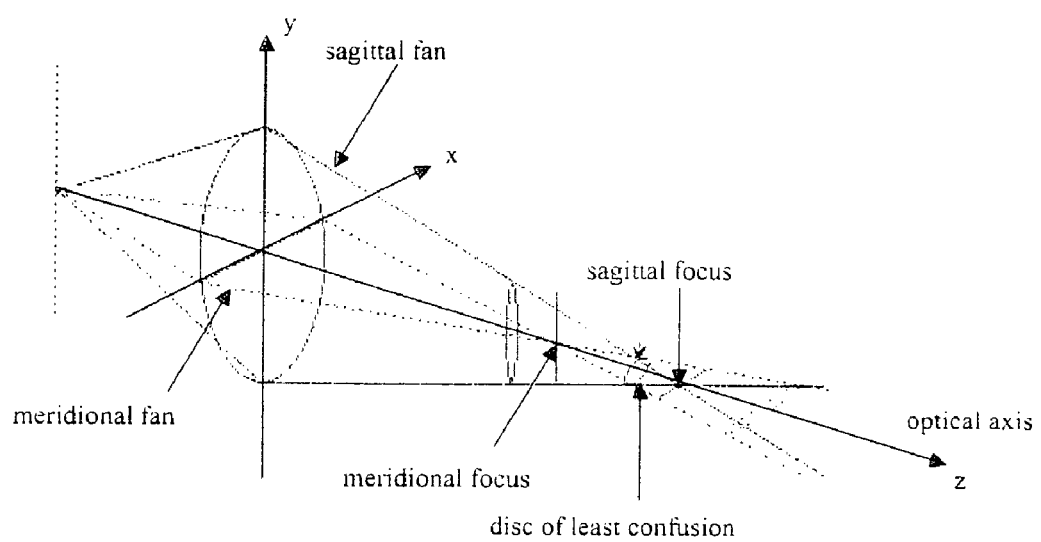
FIG. 11 shows a schematic sketch of the situation where astigmatism exists in an optical system.

At this point, a short explanation of some terms is made with reference to FIG. 11. In FIG. 11, a point located on the optical axis is imaged by a lens. The bundle of rays emanating from this on-axis point is investigated in two orthogonal planes, the so-called sagittal fan and the so-called tangential fan. The tangential fan is also called the meridional fan. Troughout this application, the terms "tangential" and "meridional" are used interchangeably.

Due to the astigmatism of the lens, the ray bundle emanating from the off-axis point is not focused in a single point. Rather, the rays lying in the sagittal fan are focused in the sagittal focus (or sagittal crossover) and the rays lying in the tangetial fan are focused in the tangential focus (or meridional crossover). The distance between the sagittal and meridional foci is called astigmatic difference. Accordingly, the beam has a considerable width in the sagittal plane at the meridional crossover and a considerable width in the meridional plane at the sagittal crossover. Within this application, such crossovers are called astigmatic crossovers.

Figure 1B:
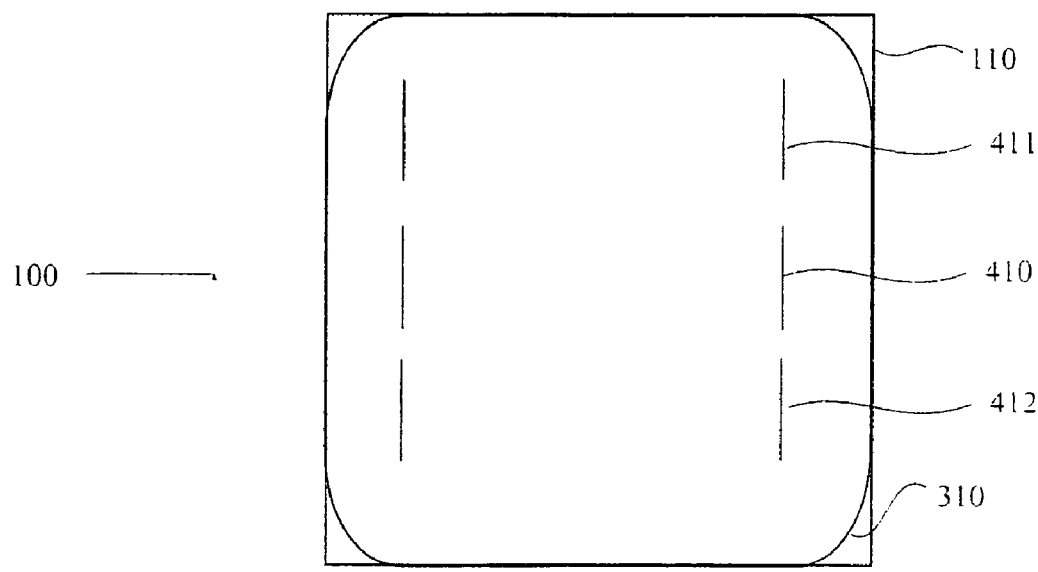

Coming now back to FIG. 1, a further embodiment of the aberration correction device according to the present invention is shown in FIG. 1b. Therein, also a Wien filter/quadrupole element 110/310 and a multipole element 410 are provided. Additionally, further multipole elements 411, 412 are comprised in the aberration correction device. Multipole elements 411 and 412 are disposed symmetrically along the optical axis with respect to the center of the Wien filter element 110 and, therefore, also symmetrically with respect to multipole element 410. The positions of the multipole elements 410, 411, 412 are adjusted so that their planes of action, i.e. the plane where a respective multipole field is effective, essentially coincide with a respective astigmatic crossover of a charged particle beam. Preferably, the multipole elements 410, 411, 412 are adjusted so that multipole elements 411 and 412 act in a plane of a sagittal or meridional crossover and multipole element 410 acts in a plane of a meridional or sagittal crossover, respectively.

Although described as an octupole, it should be understood that the multipole element 410 of FIG. 1a and also the multipole elements 410, 411, 412 of FIG. 1b can also have a design other than an octupole as long as an octupole field distribution can be generated by the multipole element. For example, the multipole elements 410, 411, 412 may be designed as a 12-pole or a 16-pole. Preferably, the multipole elements 410, 411, 412 have a 4-fold symmetry of the form 4m with m≧2. Thus, the symmetry of the quadrupole element 310 can be maintained and the multipole elements 410, 411, 412 can be easily integrated into the quadrupole element 310. Preferably, the Wien filter element 110, the quadrupole element 310 and the multipole elements 410, 411, 412 are formed integrally. However, the multipole elements 410, 411, 412 may also be formed as 10-poles etc. if 4-fold symmetry is not required. Furthermore, the multipole elements 410, 411, 412 may be identical, e.g. octupoles, but may have different designs, e.g. multipole elements 411 and 412 are octupoles whereas multipole element 410 is a 12-pole. Also, the multipole elements 410, 411, 412 may be electrostatic multipoles, magnetic multipoles or even a combination of both types.

Figure 2A:
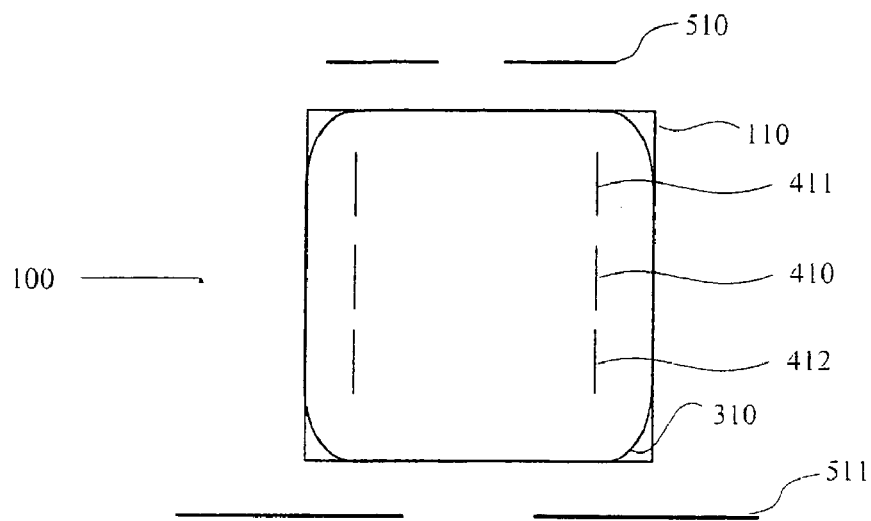

FIG. 2a shows a further embodiment of an aberration correction device according to the present invention. The device according to this embodiment comprises a device 100 as shown in FIG. 1b. Further to this, a first charged particle selection device 510 is disposed upstream the device 100. Also, a second charged particle selection device 511 is disposed downstream the device 100. The first charged particle selection element 510 can block a portion of a charged particle beam. Thereby, a charged particle beam with a defined shape can be generated. This beam shaping aperture means 510 may be considered an angle dependent selection element, since the angular spread of the charged particle beam can be limited.

Below the device 100, a second charged particle selection means 511 is disposed. The aperture of this selection means is formed so that charged particles with the nominal energy or electrons with an allowed energy deviation can pass through the electron selection means and are not blocked. Portions of the electrons with an energy deviating from the nominal energy $E_n$ can be blocked by the electron selection means. The aperture means 511 located behind optical system 100 can be considered a charged particle energy dependent selection means because of the capability to block electrons with an energy deviating from $E_n$.

Figure 2B:
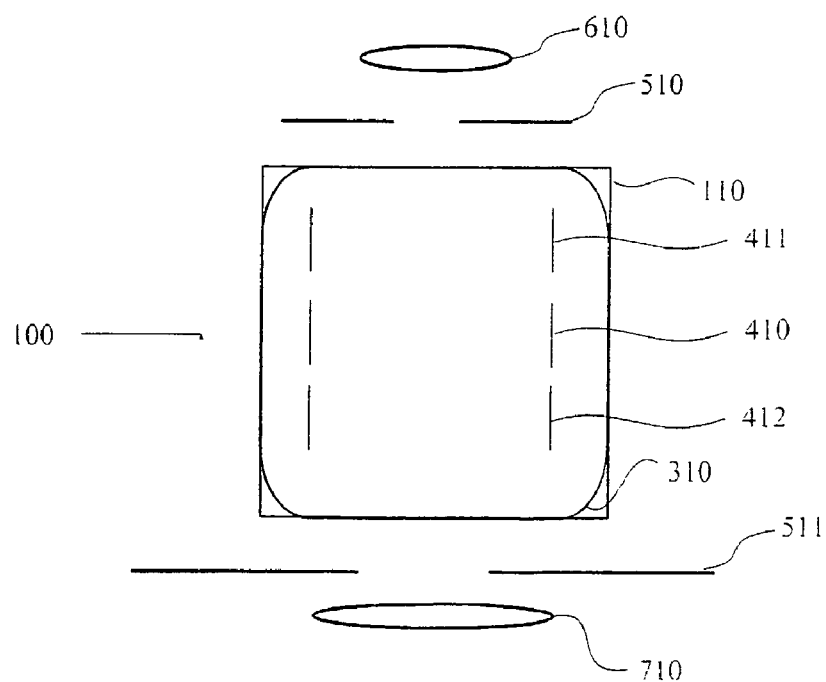

A further embodiment of the aberration correction device according to the present invention is shown in FIG. 2b. Its basic design is identical to the device shown in FIG. 2a. However, a first lens 610 is disposed upstream the device 100 and the aperture 510. Also, a second lens 710 is disposed downstream the device 100 and the aperture 511. Although the lenses 610, 710 are indicated by lens-shaped icons, it should be understood that these icons only symbolize the action of the lens fields. These lens fields are generated by electrostatic or magnetic lenses (not shown) or a combination thereof. Preferably, the lenses 610, 710 are formed as immersion lenses.

The first lens 610 is adapted to focus the charged particle beam. The first lens 610 may be a de-magnifying lens. However, without being limited thereto, it is more typical to a have a magnifying lens as the first lens 610. Typically, without being limited thereto, the second lens 610 is a de-magnifying lens. As is explained later with reference to FIGS. 6 and 7, the lenses may be located upstream or downstream of their corresponding aperture.

Next, the operation of an embodiment of the aberration correction device according to the present invention is described with reference to FIG. 3. Without limiting the scope of the present invention, the aberration correction device is used in an electron beam system. The system comprises a first lens 610, which focuses the electron beam. An electron selection means 510 blocks a portion of the electron beam. Thereby, an electron beam with the defined shape is generated.

The shaped electron beam enters an aberration correction device 100. For imaging reasons, device 100 is positioned so that the center of the system is essentially positioned at the astigmatic crossover in the x-z-plane. Electrons with an energy deviating from the nominal energy $E_n$ are influenced by the dispersion introduced by the Wien filter and are deflected. Below the optical system 100 there is a second electron selection means 511. The aperture of this selection means is formed so that electrons with the nominal energy or electrons with an allowed energy deviation can pass through the electron selection means and are not blocked. Portions of the electrons with an energy deviating from the nominal energy $E_n$ are blocked by the electron selection means. Electrons, which pass through the aperture of the electron energy dependent selection means 511, are imaged by lens 710.

As can be seen, octupole element 410 is positioned at the astigmatic crossover at the center of the Wien filter 110 so that it influences the beam essentially in a x-y-plane extending through the crossover. Since the electron beam has almost zero width in the x-direction, the octupole field generated by octupole 410 only acts on the beam in the y-direction. Thus, spherical aberration in the y-direction is corrected by octupole 410.

The beam path through the optical system 100 will now be described in the y-z-plane. In the y-z-plane, the electron beam is imaged due to the focusing action of the quadrupole element in y-direction. However, there exists a plurality of defined excitation levels, imaging the electron beam in the y-z-plane so that there is virtually no focusing effect. In such a defined excitation level, the electron beam has 2n, $n \geq 1$, astigmatic crossovers in the y-z-plane. These crossovers are located symmetrically with respect to the center plane of the Wien filter 110. Thus, the beam entering system 100 can be imaged to the exit of the system.

Similar to octupole 410, octupoles 411 and 412 are positioned at the astigmatic crossovers occurring in the y-z-plane. At these crossovers, the electron beam has almost zero width in the y-direction but finite width in the x-direction. Therefore, the octupoles 411 and 412 act virtually only on the electron beam along the x-direction. Accordingly, octupoles 411 and 412 can be used to correct spherical aberration in the x-direction.

It should be understood that the astigmatic crossovers in the x-z-plane and in the y-z-plane are sagittal or meridional crossovers. Especially, it is a pure matter of convention whether the crossover in the x-z-plane is a sagittal or a meridional crossover. However, when the crossover in the x-z-plane is defined to be a meridional crossover, the crossovers in the y-z-plane are sagittal crossovers and vice versa. Thus, the crossovers can be classified by defining one of them to be meridional or sagittal so that also the remaining crossovers are determined.

Next, a method aspect of the present application is discussed. First of all, charged particles have to be generated. The charged particles are emitted and accelerated to the nominal energy $E_n$. Thereby, the electron beam has an energy width of $\Delta E$. The electrons pass through the optical column, whereby the quadrupole component that is a part of the electron beam energy width reduction system is illuminated with a lens so that a stigmatic, i.e. round, electron beam enters the Wien filter/quadrupole component. Within the Wien filter/quadrupole component, the electrons are deflected. The deflection angle is a function of the energy of the electrons $\alpha(E)$. The energy dependent deflection is conducted in x-direction. Electrons are not focused in the x-z-plane and are virtually not focused in the y-z-plane. However, astigmatic images of the stigmatic electron beam are created by the combined action of the Wien filter and the quadrupole component. The spherical aberration is corrected by the multipole elements located at the astigmatic crossovers of the electron beam. Finally, the electrons, which have been deflected depending on their energy, are selected by an electron energy dependent selection component.

The above described method may be further expanded. Especially, the electron beam can be focused by means of said first lens so that a crossover is generated essentially at the center of the Wien filter/quadrupole component. However, it should be understood that the first lens is not essential for the generation of a crossover at the center of the Wien filter/quadrupole element. Rather, such a crossover may also be generated by the anode lens 7 (see FIGS. 6a and 6b). Furthermore, the charged particle beam can be shaped by a second lens downstream the Wien filter/quadrupole component. Especially, a crossover between the second lens and an objective lens can be generated generated.

The above methods can be used to simultaneously correct chromatic and spherical aberration in an optical system.

Figure 4A:
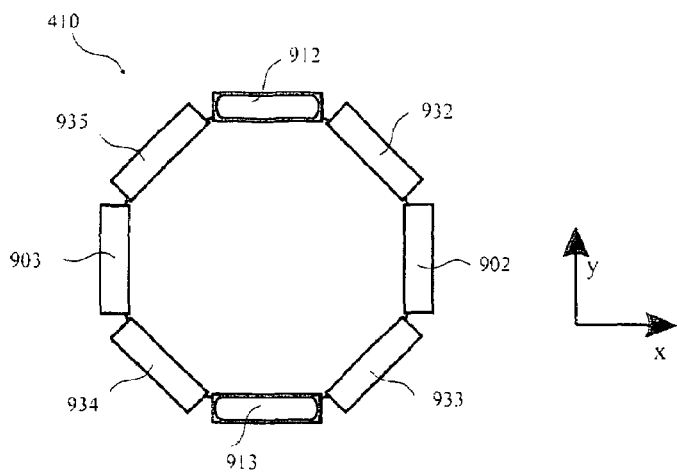
FIGS. 4a to 4c show schematic views in the direction of the z-axis of Wien filter elements, quadrupole elements and octupole elements.
Figure 4B:
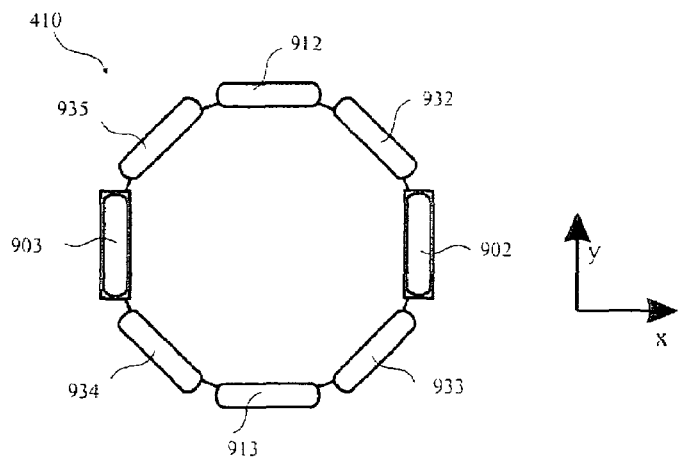
Figure 4C:
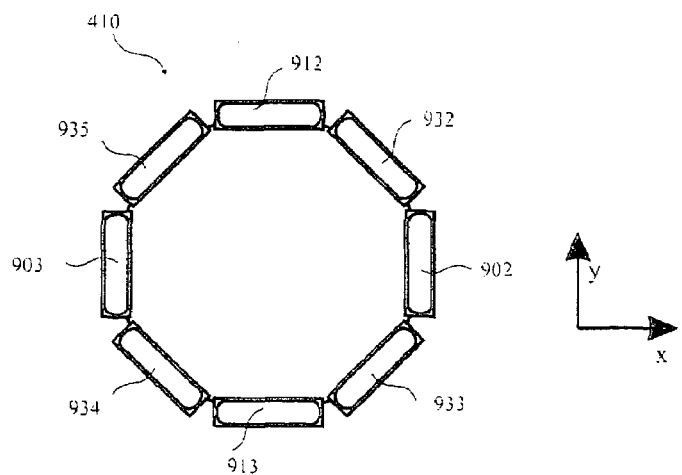

FIGS. 4a to 4c show different embodiments of the combination of the Wien filter/quadrupole element and an octupole element. The views are in direction of the z-axis. In FIG. 4a, electrostatic poles 902 and 903 together with the magnetic components of the combined electrostatic/magnetic poles 912 and 913 form the Wien filter element. The electrostatic poles are used to generate an electrostatic field in x-direction and the magnetic poles, which are generally excited by coils, are used to generate a magnetic field in y-direction. Thus, the poles 902, 903, 912 and 913 form a dipole Wien filter element.

Further, also electrostatic components are provided at poles 912 and 913. These electrostatic components together with electrostatic poles 902 and 903 form an electrostatic quadrupole which can be used to compensate for the focusing in x-direction of the Wien filter. The Wien filter element and the quadrupole element share poles. Thus, these two elements are provided as one component. Thereby, an even more simplified configuration and adjustment can be realized.

Additionally, electrostatic poles 932 to 935 are provided and rotated about 45° with respect to the poles 902 to 913 of the Wien filter/quadrupole element. Together, the electrostatic components form an electrostatic octupole which can be used to correct spherical aberration in, e.g., y-direction. Also the octupole shares poles with the combined Wien filter/quadrupole element.

FIG. 4b shows an embodiment similar to that of FIG. 4a. However, the electrostatic poles 932 to 935 of FIG. 4a are replaced by magnetic poles 932 to 935. Furthermore, the electrostatic components of poles 912 and 913 are removed whereas magnetic components have been added to poles 902 and 903. Thus, the Wien filter element is formed by the electrostatic components of poles 902 and 903, a magnetic quadrupole element is formed by the magnetic components of poles 902 and 903 and magnetic poles 912 and 913, and finally an octupole element is formed by the magnetic poles 912 to 935 together with the magnetic components of the poles 902 and 903. Again, the Wien filter element, the quadrupole and the octupole share poles.

FIG. 4c shows an illustration of a combined electrostatic/magnetic embodiment of the device according to the present invention. Thereby, two electrostatic and two magnetic poles form a dipole Wien filter. Further, an electrostatic and/or magnetic quadrupole field can be generated. Additionally, an octupole field can be generated in order to compensate for spherical aberration introduced during any imaging of a charged particle beam on a specimen. Additional dipole fields may be generated in order to align the beam.

Figure 5A:
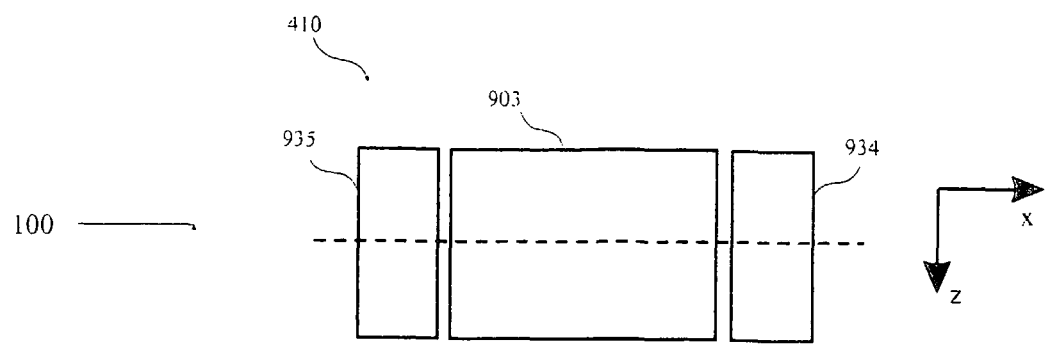
FIGS. 5a to 5d show schematic side views in the x-z-plane of different embodiments according to the present invention.

A further embodiment of the present invention is now described with respect to FIG. 5a. FIG. 5a shows a side view of an aberration correction device 100 in the x-z-plane. The aberration correction device 100 is formed by a single multipole element 410 as it is, e.g., shown in FIGS. 4a to 4c. The multipole element 410 extends along the z-direction over the full length of the aberration correction device 100. The aberration correction device 100 is placed in such a manner that the astigmatic crossover in the x-z-plane, i.e. the crossover located at the middle of the Wien filter/quadrupole element, is essentially located in the center plane (dotted line) of the aberration correction device. During operation, the multipole element 410 generates the Wien filter fields, the quadrupole field and the octupole field. Thus, the aberration correction device 100 acts essentially in the plane of the astigmatic crossovers and corrects the spherical aberration.

Figure 3:
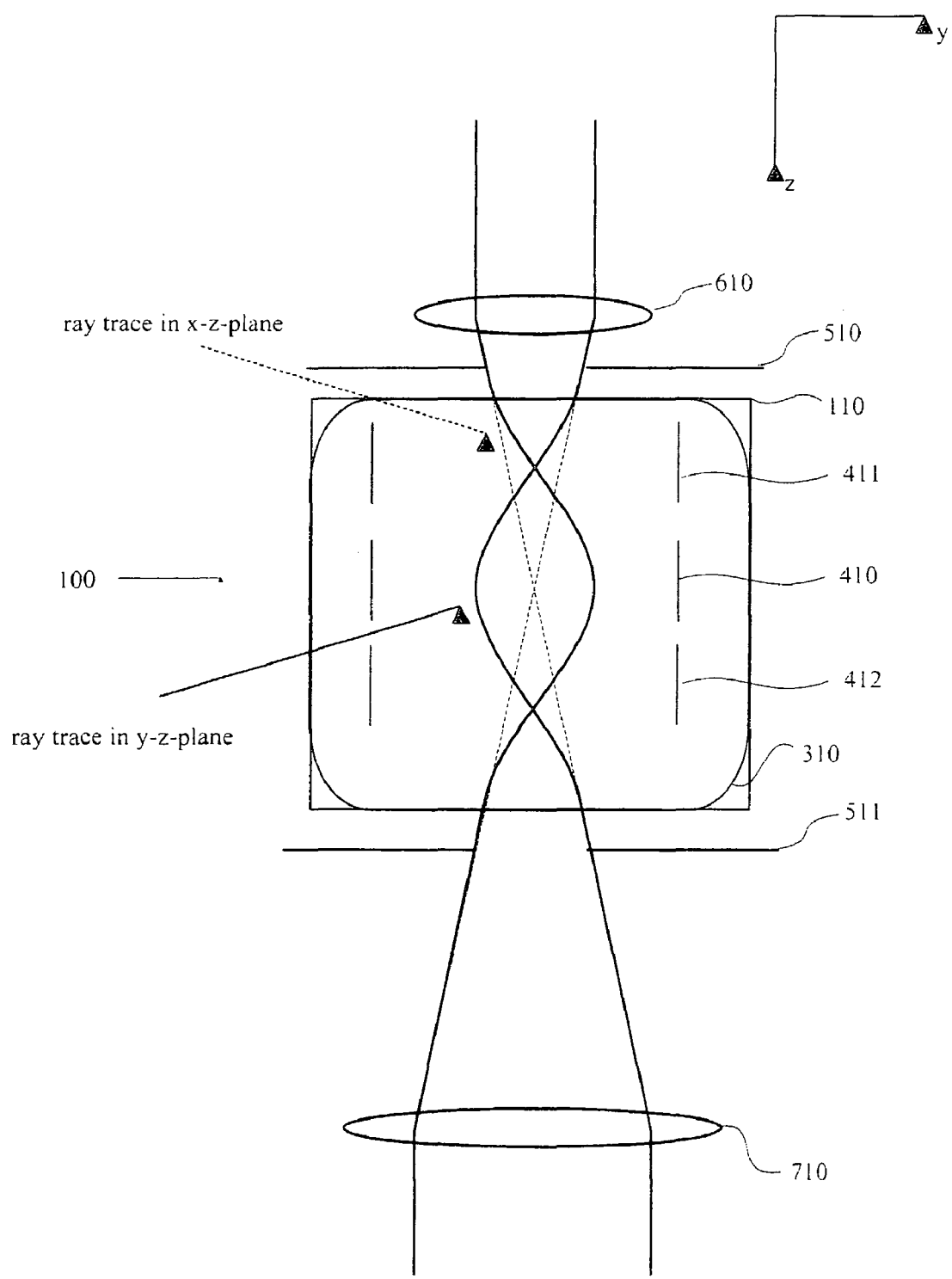
FIG. 3 shows a schematic side view in the x-z-plane and in the y-z-plane, respectively, of an embodiment according to the present invention.
Figure 5B:
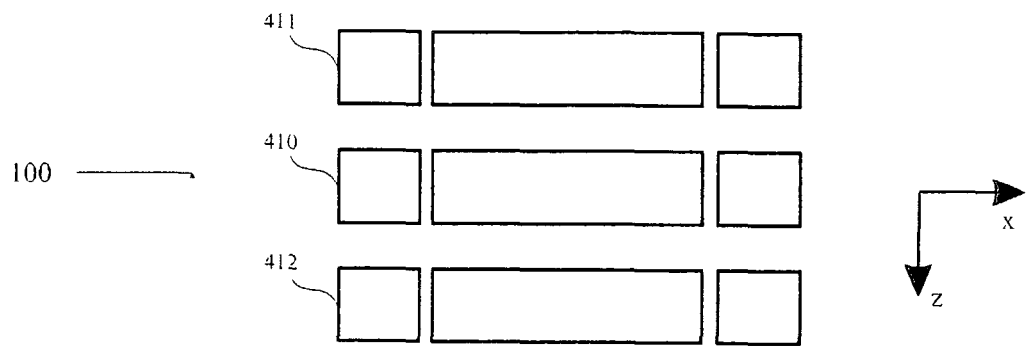

FIG. 5b shows an improved embodiment of an aberration correction device according to the present invention similar to the one shown in FIGS. 1b and 3. Therein, three multipole elements 410, 411, 412 are stacked on top of each other. The multipole elements 410, 411, 412 are arranged in such manner that an astigmatic crossover is essentially located at a respective center plane of a corresponding multipole element. For example, the astigmatic crossover in the x-z-plane is located at the center plane of multipole element 410 and further astigmatic crossovers are located at the center planes of multipole elements 411 and 412, respectively. During operation, the multipole elements 410, 411 and 412 generate the Wien filter fields, the quadrupole fields and the octupole fields. Thus, the multipole elements 410, 411, 412 act essentially in the planes of the astigmatic crossovers and correct the spherical aberration in the x- and in the y-direction.

Figure 5C:
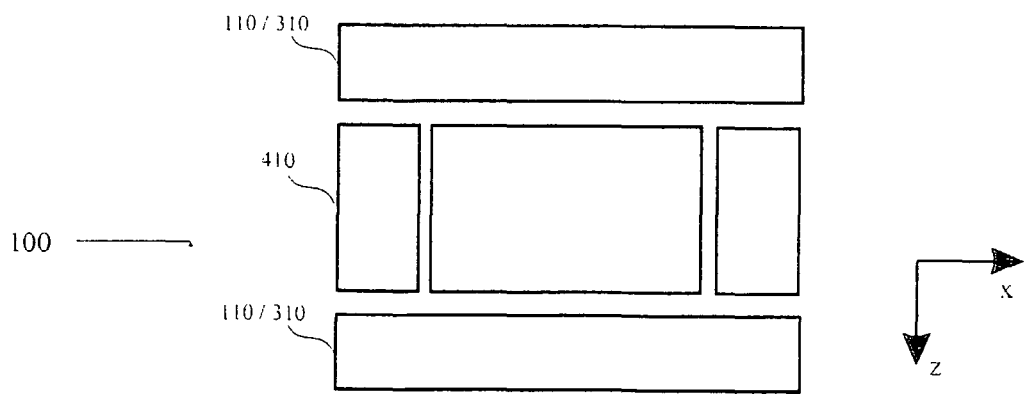

A further embodiment of the aberration correction device according to the present invention is shown in FIG. 5c. Therein, a multipole element 410 is sandwiched between two combined Wien filter/quadrupole elements 110/310. Due to the finite length of the multipole element 410 along the z-direction, the field generated by the multipole element influences also the space above and below the central crossover. Particularly, the multipole element 410 acts also on the astigmatic crossovers above and below the central crossover. In this context, it should be noted that the octupole field has essentially the same radial dependency in x- and y-direction so that it can correct spherical aberration in either direction. It is therefore possible to achieve an effect similar to the one shown in FIG. 3 by a multipole element that does not extend along the z-direction over the full length of its action. However, it should be understood that such an embodiment will not provide best results but is sufficient for some applications.

An even further embodiment of the aberration correction device according to the present invention is now described with reference to FIG. 5d. This embodiment is similar to the one shown in FIG. 5b. However, combined Wien filter/quadrupole elements 110/310 have been inserted between the multipole elements 410, 411, 412 to provide the field of the combined Wien filter/quadrupole between the multipole elements. Also in this embodiment, the multipole elements 410, 411, 412 are arranged in such manner that an astigmatic crossover is essentially located at a respective center plane of a corresponding multipole element. In an even further embodiment which is not shown, additional Wien filter/quadrupole elements 110/310 are provided upstream multipole element 411 and downstream multipole element 412 similar to the embodiment shown in FIG. 5c.

Figure 5D:
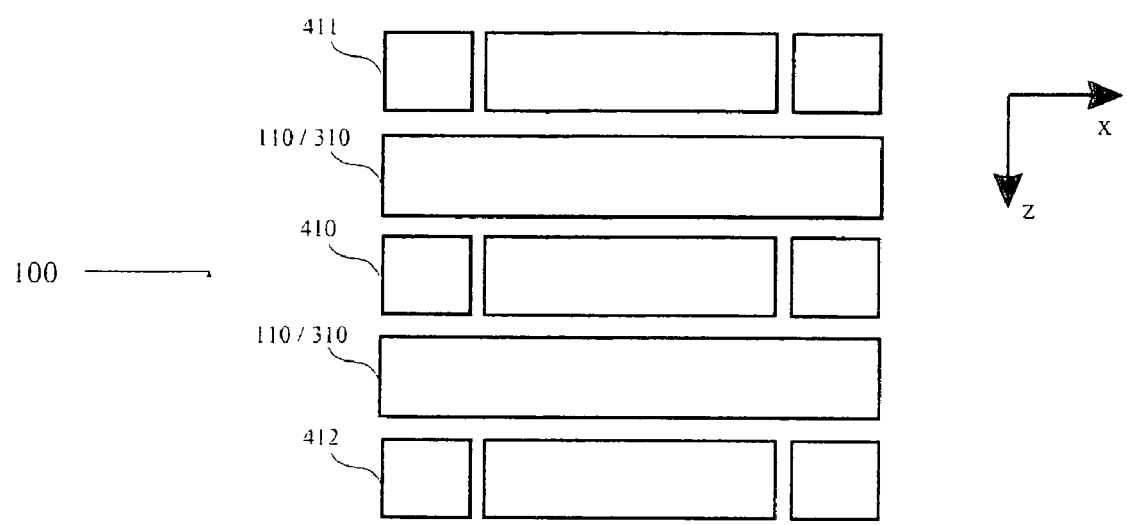

It should be understood that in the embodiments shown in FIGS. 5b to 5d the relative dimensions with respect to each other of the multipole elements 410, 411, 412 and of the Wien filter/quadrupole elements 110/310 may be varied. Especially, the multipole elements 410, 411, 412 can have a considerably smaller extension along the z-axis than the Wien filter/quadrupole elements 110/310. Furthermore, the multipole elements 410, 411, 412 as well as the Wien filter/quadrupole elements 110/310 may be differently spaced. Especially, a means for mechanical adjustment of the position of the individual elements can be provided. Typically, the multipole elements 410, 411, 412 and the combined Wien filter/quadrupole elements 110/310 are closely spaced. Accordingly, FIGS. 5b to 5d should only be understood as schematic illustrations. The spacing between the multipole elements 410, 411, 412 and the combined Wien filter/quadrupole elements 110/310 can be provided by air gaps or by an isolating disk (not shown).

Aside from spherical aberration correction, it is further possible to use the poles to align the charged particle beam by introducing an additional dipole field. As described above, the position of an electron along the x-direction decides whether or not that electron is blocked at electron selection element 511. Thus, an alignment of the electron beam with an additional dipole element can be used to select the energies that are blocked by the electron energy width reduction system, i.e. the combined Wien filter/quadrupole element.

Embodiments of electron beam columns utilizing an aberration correction system are described in FIGS. 6a to 7c. All of these embodiments show an electron beam column 1 wherein an electron beam is emitted by emitter 6. The column comprises a housing 2 and the specimen chamber 3, both of which can be evacuated. The electron beam travelling substantially along the optical axis 5 impinges on specimen 4.

Within FIG. 6a, the emitted electrons that are accelerated by anode lens 7 and form a first crossover below the anode lens. Illumination lens 610 illuminates the aberration correction device 100. A portion of the electron beam is blocked by electron selection element 510 before entering the aberration correction component 100. Thereby, a defined beam shape is generated. Lens 610 illuminates the aberration correction device 100 such that the generated crossover is located in the center of the device. Aberration correction device 100 does not have any focusing effect in the x-z-plane and has virtually no focusing effect in the y-z-plane. Therefore, the excitation can be increased to realize a desired dispersion. The electrons, which are deflected due to the dispersion can be selected by electron energy dependent selection element 511. Thus, the energy width of the electron beam and, accordingly, chromatic aberration are reduced. Also, the multipole elements of aberration correction device 100 are excited as to correct spherical aberration in the x- or y-direction, respectively. Objective lens 710 is then used to focus the electron beam on the specimen. Independent of specific embodiments, the aberration correction device 100 comprises a dipole Wien filter, a quadrupole element, and a multipole element capable of correcting spherical aberration. Further independent of specific embodiments, separate components for generating the Wien filter fields, the quadrupole field and the multipole field can be provided or, alternatively, a single component for generating these fields can be provided.

Contrary to the embodiment of FIG. 6a, the embodiment of FIG. 6b comprises an electron angle dependent selection element 510 that is positioned above the illumination lens 610. FIG. 6b further shows an electron energy dependent selection element 511 that is positioned below the objective lens 710.

However, according to a further embodiment (not shown) it is also possible to have the electron selection element 510, which acts like an aperture, above illumination lens 610 and to have electron energy dependent selection element 511 above objective lens 710.

The embodiments shown in FIGS. 7a and 7b have a first magnifying illumination lens 610 above the aberration correction element 100, have a second demagnifying lens 710, and have an objective lens 8.

FIG. 7a shows electron selection element 510 and 511 which are directly neighboring the aberration correction element 100. The electron selection element 510, which is positioned above, is an electron angle dependent selection element. The electron selection element 511, which is positioned below, is an electron energy dependent selection element.

Within FIG. 7b, the first electron selection element 510 is positioned above the first lens 610 and the second electron selection element 511 is positioned below second lens 710. Again, according to further embodiments (not shown), both of the electron selection elements can be positioned above the respective lenses or, alternatively, below the respective lenses.

As can be seen from the above description referring to FIGS. 6a to 7b and the other embodiments described in the present application, the aberration correction system is a straight vision system. Thereby, the optical axis and the z-axis coincide. The charged particle beam energy width reduction systems disclosed within this application are preferably, without limiting the invention thereto, straight vision systems. That is, the beam entering and leaving the system share a common straight optical axis. Nevertheless, the system may also be a non-straight vision system.

An example of such a system might be the following. In the presence of e.g. ionized molecules, which are accelerated in direction of the emitter, these ions could damage the emitter on impingement thereon. Utilizing a non-straight vision system, the ions would not impinge on the emitter because a possible beam curvature differs from e.g. electrons to ions. Such a system is e.g. described in FIG. 7c.

Figure 7C:
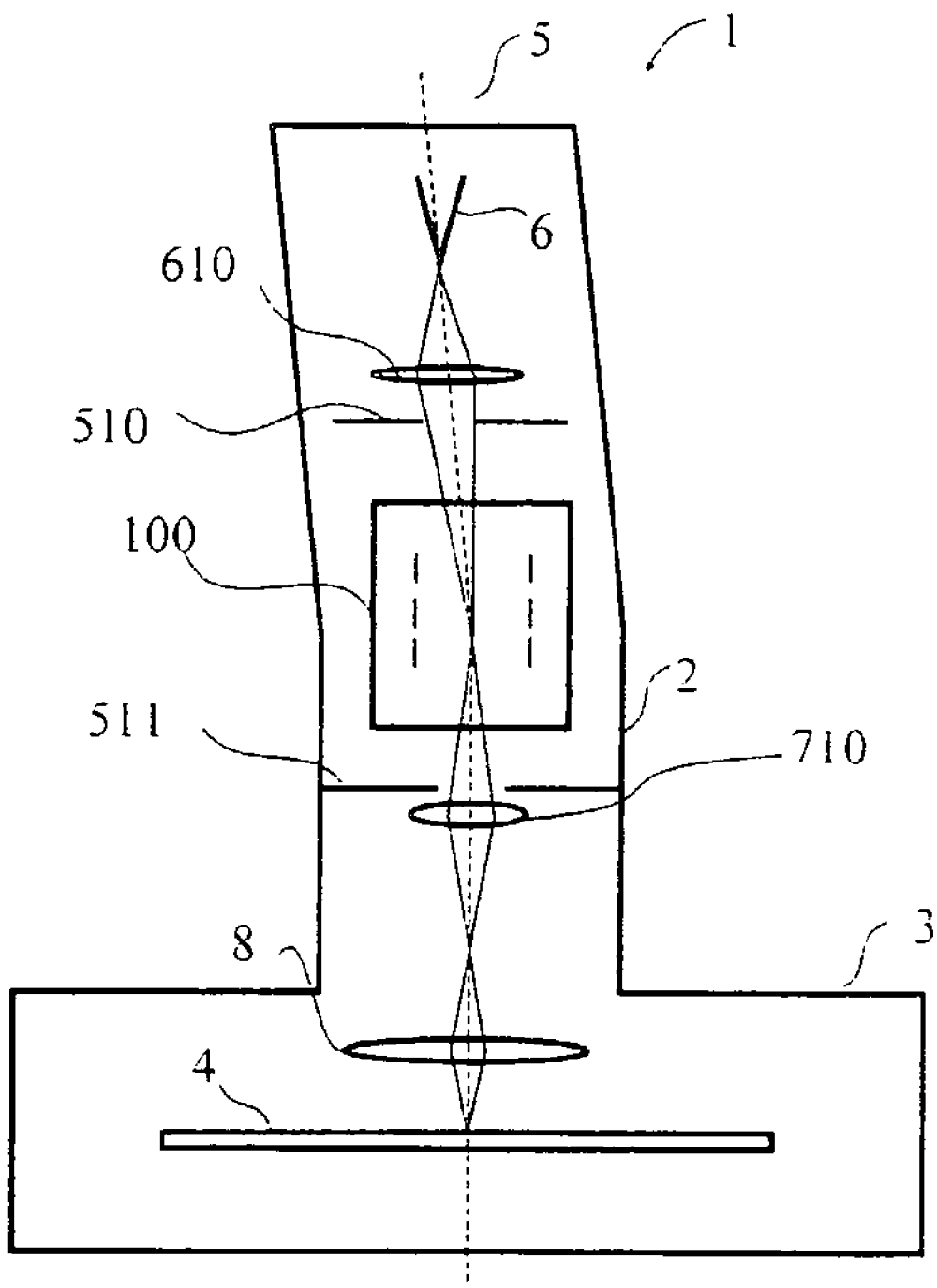
FIG. 7c shows a schematic side view of a further exemplary embodiment of a charged particle beam column with a charged particle beam energy width reduction system.

FIG. 7c mainly correlates to FIG. 7a. However, the optical axis 5 is not straight. In the case of an element acting in a focusing and dispersive manner, the optical axis may be curved. The electrons emitted by emitter 6 are additionally deflected in aberration correction component 100. Thereby, according to a simplified consideration, the optical axis has two parts which are slightly tilted with respect to each other. The deflection angle could, in the case of a Wien filter element, typically be greater than 0° and smaller than about 30°. Ionized molecules that are accelerated towards emitter 6 within the electron beam column do not have the same beam path as the primary electrons. Thus, emitter-damage may be reduced. This aspect referring to a non-straight vision system may be combined with any of the embodiments described above.

The invention claimed is:

1. An aberration correction device, comprising:
a Wien filter element;
a quadrupole element for compensating a focusing property of said Wien filter element; and
at least one multipole element for spherical aberration correction, wherein said Wien filter element and said quadrupole element are adapted to generate, in combination, an astigmatic image and wherein said at least one multipole element is adapted to act essentially in a plane of sagittal or meridional focus of said astigmatic image.

2. The aberration correction device according to claim 1, wherein said at least one multipole element is a 4m-pole element with $m \geq 2$.

3. The aberration correction device according to claim 1, wherein said Wien filter element and said quadrupole element are adapted to generate an astigmatic crossover of a charged particle beam in a first plane at the center of the Wien filter element and 2n astigmatic crossovers $n \geq 1$, of said charged particle beam in a second plane and positioned symmetrically with respect to said crossover at the center of said Wien filter element.

4. The aberration correction device according to claim 3, wherein said at least one multipole element is adapted to act essentially in a plane perpendicular to said first plane and extending through said astigmatic crossover at the center of said Wien filter element.

5. The aberration correction device according to claim 3, wherein said at least one multipole element is adapted to act essentially in a plane perpendicular to said second plane and extending through a selected one of said 2n astigmatic crossovers.

6. The aberration correction device according to claim 3, further comprising one to 2n additional multipole elements, each being adapted to act in a plane perpendicular to said first or second plane and extending through a selected one of said 2n astigmatic crossovers or said astigmatic crossover at the center of said Wien filter element.

7. The aberration correction device according to claim 3, wherein said first plane and said second plane are substantially perpendicular to each other.

8. The aberration correction device according to claim 3, wherein the first plane is the x-z-plane.

9. The aberration correction device according to claim 3, wherein the second plane is the y-z-plane.

10. The aberration correction device according to claim 1, wherein said at least one multipole element comprises a magnetic multipole element.

11. The aberration correction device according to claim 1, wherein said at least one multipole element comprises an electrostatic multipole element.

12. The aberration correction device according to claim 1, wherein said at least one multipole element comprises a combined electrostatic and magnetic multipole element.

13. The aberration correction device according to claim 1, wherein said at least one multipole element is an octupole.

14. The aberration correction device according to claim 1, wherein said at least one multipole element is integrated into said quadrupole element.

15. The aberration correction device according to claim 1, wherein said aberration correction device comprises a plurality of multipole elements which are aligned along the optical axis.

16. The aberration correction device according to claim 15, further comprising combined Wien filter/quadrupole elements aligned with the optical axis and disposed upstream and downstream said plurality of multipole elements.

17. The aberration correction device according to claim 16, wherein said combined Wien filter/quadrupole elements aligned with the optical axis are interposed between said multipole elements.

18. The aberration correction device according to claim 1, further comprising a first charged particle selection element being positioned upstream said Wien filter element.

19. The aberration correction device according to claim 18, wherein said first charged particle selection element is a charged particle angle dependent selection element.

20. The aberration correction device according to claim 18, further comprising a second charged particle selection element being positioned downstream said Wien filter element.

21. The aberration correction device according to claim 20, wherein said second charged particle selection element is a velocity and angle dependent selection element.

22. The aberration correction device according to claim 1, further comprising a first lens for generating a crossover essentially at the center of said Wien filter element.

23. The aberration correction device according to claim 22, further comprising a second lens downstream said Wien filter element.

24. The aberration correction device according to claim 23, wherein said first lens is a magnification lens and said second lens is a demagnification lens.

25. The aberration correction device according to claim 23, wherein said first and second lenses are immersion lenses, said first lens is adapted for decelerating charged particles before entering said Wien filter element, and said second lens is adapted for accelerating the charged particles after leaving said Wien filter element.

26. A charged particle beam device comprising:
a source of a beam of charged particles;
an aberration correction device comprising:
  a Wien filter element;
  a quadrupole element for compensating a focusing property of said Wien filter element; and
  at least one multipole element for spherical aberration correction, wherein said Wien filter element and said quadrupole element are adapted to generate, in combination, an astigmatic image and wherein said at least one multipole element is adapted to act essentially in a plane of sagittal or meridional focus of said astigmatic image; and
an objective lens for focusing said beam of charged particles on a surface of a specimen to be inspected.

27. A method of operating a charged particle device comprising:
producing a substantially stigmatic beam of charged particles;
providing an aberration correction device, comprising:
  a Wien filter element;
  a quadrupole element for compensating a focusing property of said Wien filter element; and
  at least one multipole element for spherical aberration correction, wherein said Wien filter element and said quadrupole element are adapted to generate, in combination, an astigmatic image and wherein said at least one multipole element is adapted to act essentially in a plane of sagittal or meridional focus of said astigmatic image;
controlling said Wien filter element and said quadrupole element so that their combined action generates an astigmatic image of the beam; and
controlling said at least one multipole element so that a spherical aberration in a plane perpendicular to the plane of a crossover associated with said at least one multipole element is corrected.

28. The method according to claim 27, further comprising controlling a plurality of multipole elements to correct a spherical aberration in a respective plane perpendicular to a plane of a respective crossover associated with a respective one of said multipole elements.

29. The method according to claim 27, further comprising selecting charged particles with a charged particle selection element.

30. The method according to claim 27, further comprising focusing the beam of charged particles by means of a first lens so that a crossover is generated essentially at the center of the Wien filter element.

31. The method according to claim 30, further comprising shaping said beam of charged particles by a second lens downstream said Wien filter element.

32. The method according to claim 31, wherein a crossover between said second lens and an objective lens is generated.

* * * * *